US012527234B2

(12) United States Patent
Najafi-Yazdi

(10) Patent No.: US 12,527,234 B2
(45) Date of Patent: Jan. 13, 2026

(54) METHOD FOR FABRICATING TUNNEL JUNCTIONS

(71) Applicant: ANYON SYSTEMS INC., Dorval (CA)

(72) Inventor: Alireza Najafi-Yazdi, Vaudreuil-Dorion (CA)

(73) Assignee: ANYON SYSTEMS INC., Dorval (CA)

( * ) Notice: Subject to any disclaimer, the term of this patent is extended or adjusted under 35 U.S.C. 154(b) by 303 days.

(21) Appl. No.: 17/828,358

(22) Filed: May 31, 2022

(65) Prior Publication Data

US 2022/0393092 A1 Dec. 8, 2022

Related U.S. Application Data

(60) Provisional application No. 63/196,751, filed on Jun. 4, 2021.

(51) Int. Cl.
*H10N 60/01* (2023.01)

(52) U.S. Cl.
CPC ............... *H10N 60/0912* (2023.02)

(58) Field of Classification Search
None
See application file for complete search history.

(56) References Cited

U.S. PATENT DOCUMENTS

| | | | | |
|---|---|---|---|---|
| 5,360,698 A * | 11/1994 | Hanrahan | ............... | G03F 7/095 430/326 |
| 6,001,734 A * | 12/1999 | Drynan | ............ | H01L 21/76877 257/E21.585 |
| 6,130,167 A * | 10/2000 | Tao | ................... | H01L 21/02071 257/E21.255 |
| 2005/0069433 A1* | 3/2005 | Hayashi | .............. | G03F 7/70916 417/423.4 |
| 2005/0277064 A1* | 12/2005 | Lamarre | ............... | G03F 7/0035 430/312 |
| 2008/0014416 A1* | 1/2008 | Raju | .................... | G03G 7/0086 428/195.1 |
| 2009/0189515 A1* | 7/2009 | Halls | .................... | H10K 50/841 428/76 |

(Continued)

OTHER PUBLICATIONS

Tsioutsios et al., Free-standing silicon shadow masks for transmon qubit fabrication, arXiv:1911.05924v2, Aug. 16, 2020, 8 pages.

(Continued)

*Primary Examiner* — Erik T. K. Peterson
*Assistant Examiner* — Christopher A. Schodde
(74) *Attorney, Agent, or Firm* — McDonald Hopkins LLC

(57) ABSTRACT

There is described herein a method for fabricating a tunnel junction. The method comprises coating a substrate with an inorganic resist layer and forming support pillars in the resist layer; fabricating a mask on the resist layer from a first inorganic material, the mask having at least one opening; removing the resist layer from beneath the mask, leaving behind the support pillars supporting the mask above the substrate; performing shadow evaporation on the substrate through the at least one opening of the mask to form the tunnel junction on the substrate; and removing the mask and the support pillars from the substrate.

9 Claims, 11 Drawing Sheets

(56) References Cited

U.S. PATENT DOCUMENTS

| | | | |
|---|---|---|---|
| 2010/0119763 A1* | 5/2010 | Aoki | B82Y 40/00 |
| | | | 430/296 |
| 2012/0241411 A1* | 9/2012 | Darling | H01L 21/3065 |
| | | | 216/67 |
| 2019/0103306 A1* | 4/2019 | Lin | H01L 21/76802 |
| 2019/0131513 A1 | 5/2019 | Krogstrup et al. | |
| 2019/0137891 A1* | 5/2019 | Brink | H10N 50/01 |
| 2020/0371438 A1 | 11/2020 | Wang et al. | |
| 2021/0041784 A1 | 2/2021 | Chen et al. | |
| 2021/0333709 A1 | 10/2021 | Lee et al. | |
| 2022/0091497 A1 | 3/2022 | Yun et al. | |
| 2022/0115383 A1 | 4/2022 | Yoon et al. | |
| 2022/0140223 A1 | 5/2022 | Gao et al. | |

OTHER PUBLICATIONS

Lecocq et al., Junction fabrication by shadow evaporation without a suspended bridge, 2011 Nanotechnology 22 315302, http://stacks.iop.org/Nano/22/315302, Jul. 8, 2011, 7 pages.

Welander et al., Shadow evaporation of epitaxial Al/Al2O3/Al tunnel junctions on sapphire utilizing an inorganic bilayer mask, arXiv:1203.6007v1, Mar. 27, 2012, 4 pages.

\* cited by examiner

METHOD FOR FABRICATING TUNNEL JUNCTIONS

CROSS-REFERENCE TO RELATED APPLICATIONS

The present application claims the benefit of U.S. Provisional Patent Application No. 63/196,751 filed on Jun. 4, 2021, the contents of which are hereby incorporated by reference in their entirety.

TECHNICAL FIELD

The present disclosure generally relates to nanofabrication, and more specifically, to techniques for forming tunnel junctions such as those used for quantum computing applications.

BACKGROUND OF THE ART

Quantum computers are machines that harness the properties of quantum states, such as superposition, interference, and entanglement, to perform computations. In a quantum computer, the basic unit of memory is a quantum bit, or qubit, which can only be detected at extremely low energy levels and at temperatures close to absolute zero. A quantum computer with enough qubits has a computational power inaccessible to a classical computer, which is referred to as "quantum advantage".

Certain types of qubits, such as superconducting qubits, consist of Josephson junctions, which are made by sandwiching a weak barrier between two layers of superconducting material. The barrier can be an insulator, a non-superconducting metal, or a physical constriction that weakens the superconductivity at the point of contact. Electrons (or quasiparticles) pass through the barrier by a process of quantum tunnelling.

While existing methods for fabricating Josephson junctions are suitable for their purposes, improvements are desired.

SUMMARY

In accordance with a broad aspect, there is provided a method for fabricating a tunnel junction. The method comprises coating a substrate with an inorganic resist layer and forming support pillars in the resist layer; fabricating a mask on the resist layer from a first inorganic material, the mask having at least one opening; removing the resist layer from beneath the mask, leaving behind the support pillars supporting the mask above the substrate; performing shadow evaporation on the substrate through the at least one opening of the mask to form the tunnel junction on the substrate; and removing the mask and the support pillars from the substrate.

Features of the systems, devices, and methods described herein may be used in various combinations, in accordance with the embodiments described herein.

BRIEF DESCRIPTION OF THE DRAWINGS

Reference is now made to the drawings, in which.

DETAILED DESCRIPTION

The present disclosure is directed to the fabrication of tunnel junctions. In some embodiments, the tunnel junctions are Josephson tunnel junctions. In some embodiments, the tunnel junctions are used in superconducting quantum computing applications, for example as part of qubits. The tunnel junctions fabricated using the methods described herein may also be used for other applications, as will be understood by those skilled in the art.

Figure 1A:
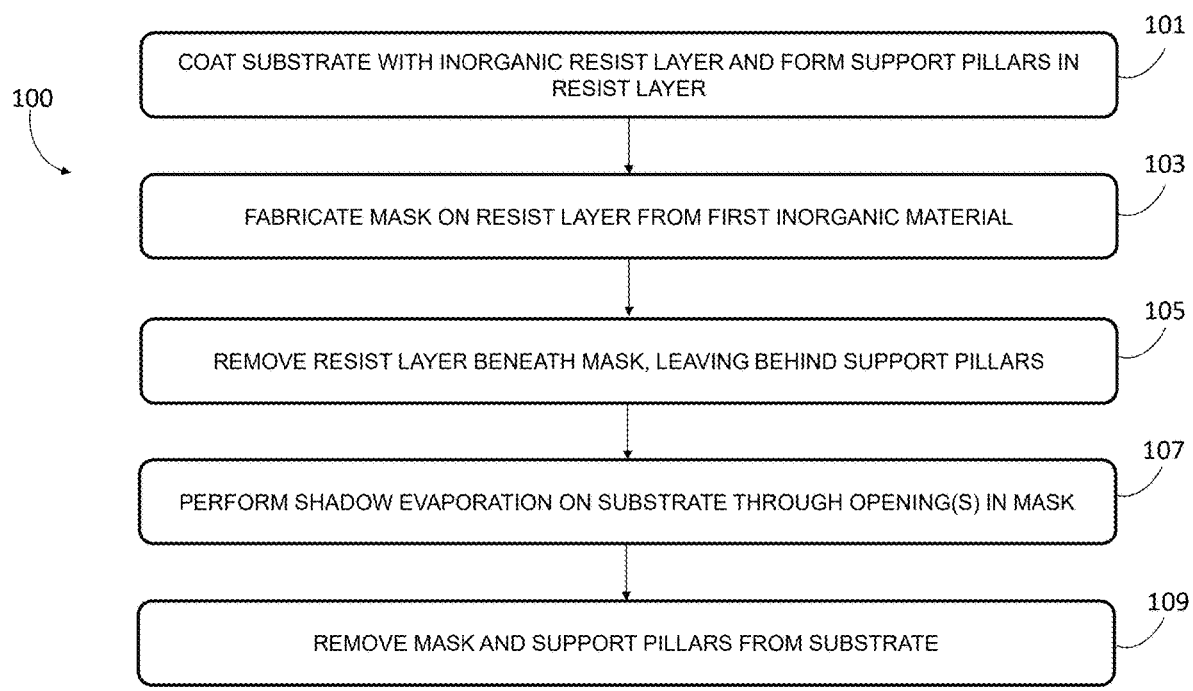
FIGS. 1A and 1B are flowcharts of example methods for fabricating a tunnel junction.
Figure 1B:
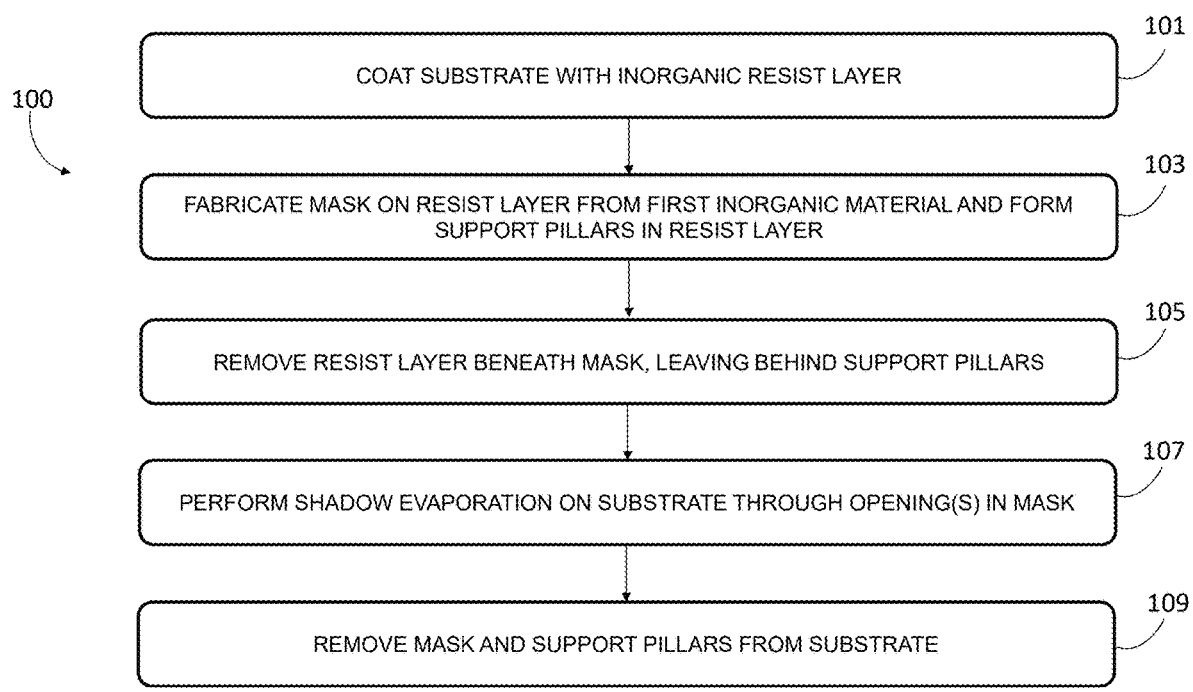

With reference to FIGS. 1A and 1B, a method 100 of fabricating a tunnel junction is provided. At step 101, a substrate is coated with an inorganic resist layer and support pillars are formed in the resist layer. At step 103, a mask is fabricated on the resist layer from a first inorganic material. The mask has at least one opening through which the tunnel junction will be formed. At step 105, the resist layer underneath the mask is removed, leaving behind the support pillars supporting the mask above the substrate. At step 107, shadow evaporation is performed on the substrate through the opening(s) of the mask to form the tunnel junction on the substrate. At step 109, the mask and support pillars are removed from the substrate, leaving behind the fabricated tunnel junction. The fabrication steps of the method 100 are described in more detail below.

Figure 2:
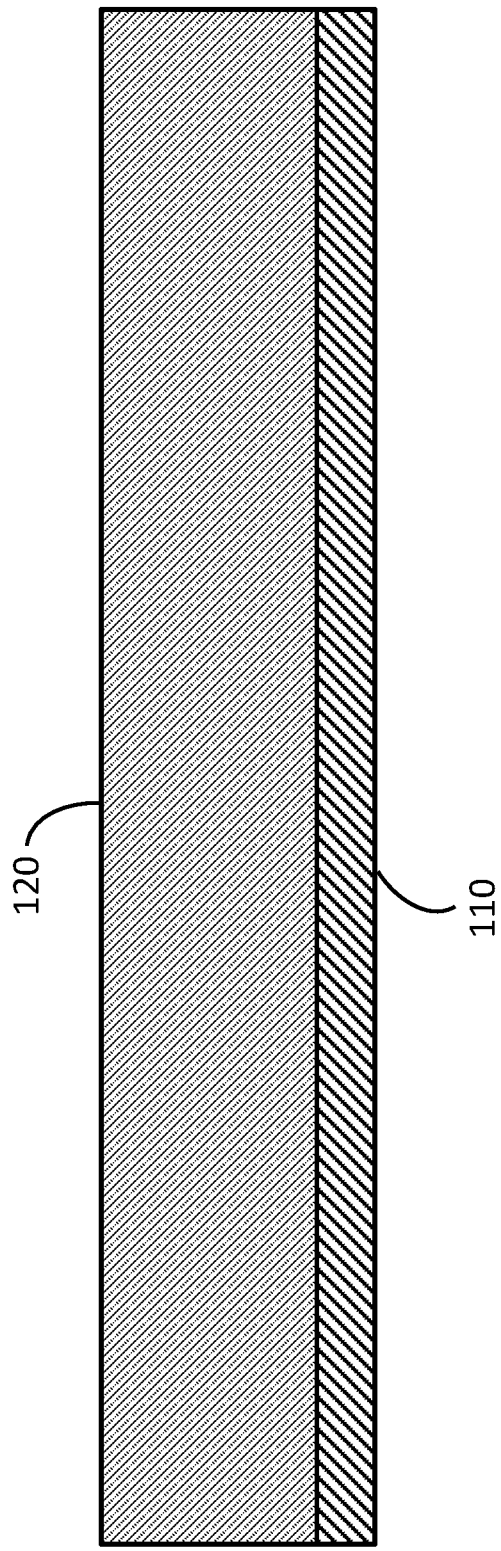
FIG. 2 is a partial cross-sectional view of a substrate coated with a resist layer.

FIG. 2 illustrates an example of a substrate 110 coated with an inorganic primary resist layer 120, as per step 101 of the method 100. The substrate 110 is a wafer on which the tunnel junction will be fabricated. A plurality of tunnel junctions may be fabricated on a same substrate 110, concurrently or sequentially. The substrate 110 may be of various dimensions, from a larger substrate (e.g., 1 cm×1 cm) to a smaller substrate (e.g., 1 mm×1 mm). The substrate 110 may have a large number (e.g., 250 to 300) or a small number (e.g., 1 to 50) of tunnel junctions fabricated thereon. Other sizes and quantities may also be used. For simplicity, fabrication of a single tunnel junction is illustrated herein. The substrate 110 may or may not have been taken through various nanofabrication steps to create other elements of a device thereon. In some embodiments, the additional nanofabrication steps are performed after the tunnel junction has been fabricated. Various materials may be used for the substrate 110, including but not limited to high resistivity silicon, sapphire, or silicon on insulator. The inorganic resist layer 120 may be, for example, hydrogen silsesquioxane (HSQ) and hafnium peroxide sulfate (HafSOx). Using an inorganic resist rather than an organic resist ensures that no organic residues will contaminate the junction.

Figure 3:
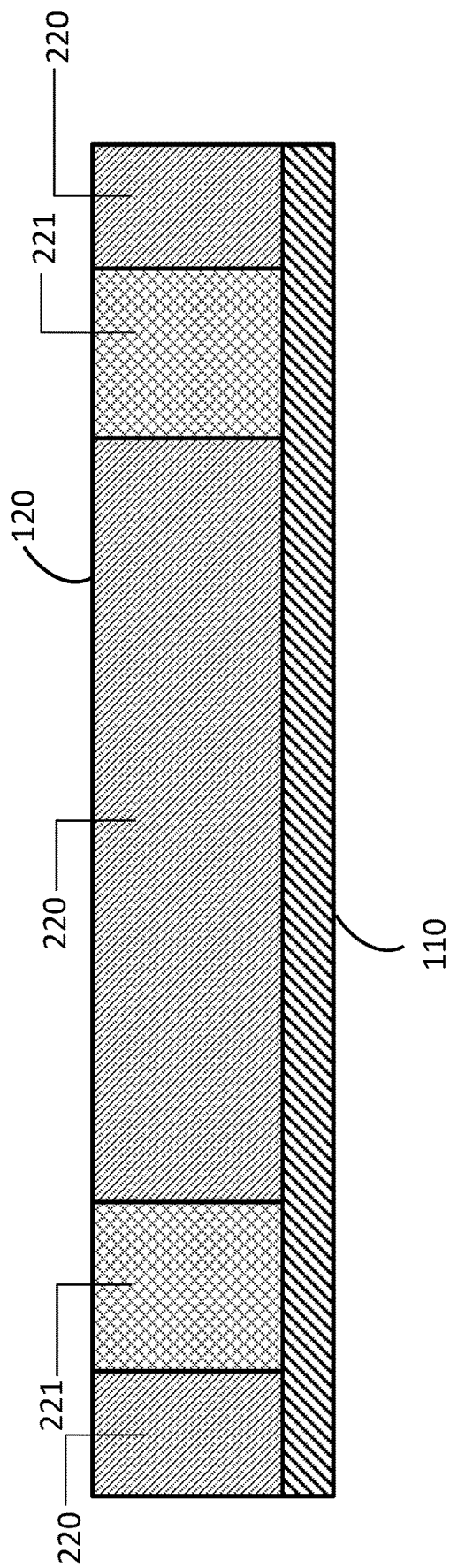
FIG. 3 is a partial cross-sectional view of a substrate coated with a resist layer having support pillars formed therein.

With reference to FIG. 3, support pillars 221 are formed in the resist layer 120. Although two support pillars 221 are illustrated, more than two may be formed. In some embodiments, the support pillars 221 are patterned in the resist layer 120 using lithography, which may be photolithography, extreme ultraviolet lithography, e-beam lithography, or any other type of lithography. One or more lithography steps may be performed. The resist layer 120 may be exposed so as to undergo cross-linking only in the areas corresponding to the support pillars 221, thus forming the support pillars 221. In some embodiments, the resist layer 120 is exposed so as to undergo cross-linking in areas 220 outside of the support pillars 221. The resist layer 120 is then developed, creating openings in the resist layer 120 in which a pillar material may be deposited or grown to form the support pillars 221. The pillar material may be various inorganic materials, such as but not limited to silicon or silicon oxide.

Figure 4:
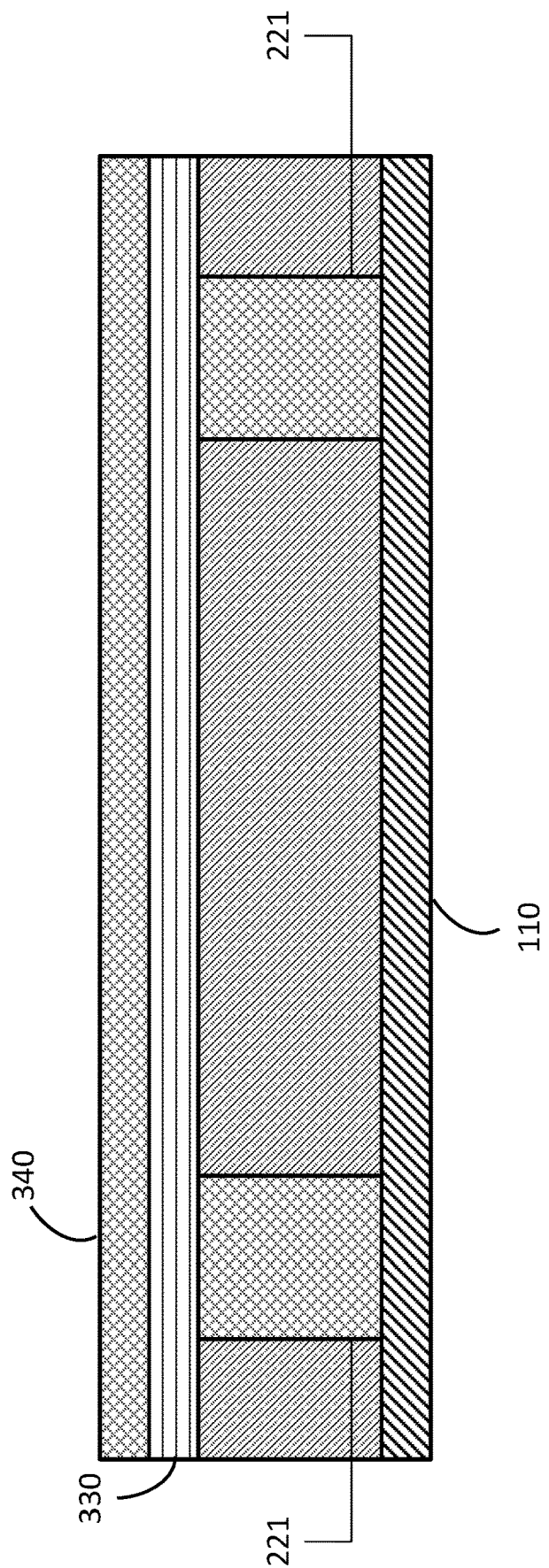
FIG. 4 is a partial cross-sectional view of a substrate coated with a resist layer having support pillars formed therein, topped with a mask layer and secondary resist layer.
Figure 5:
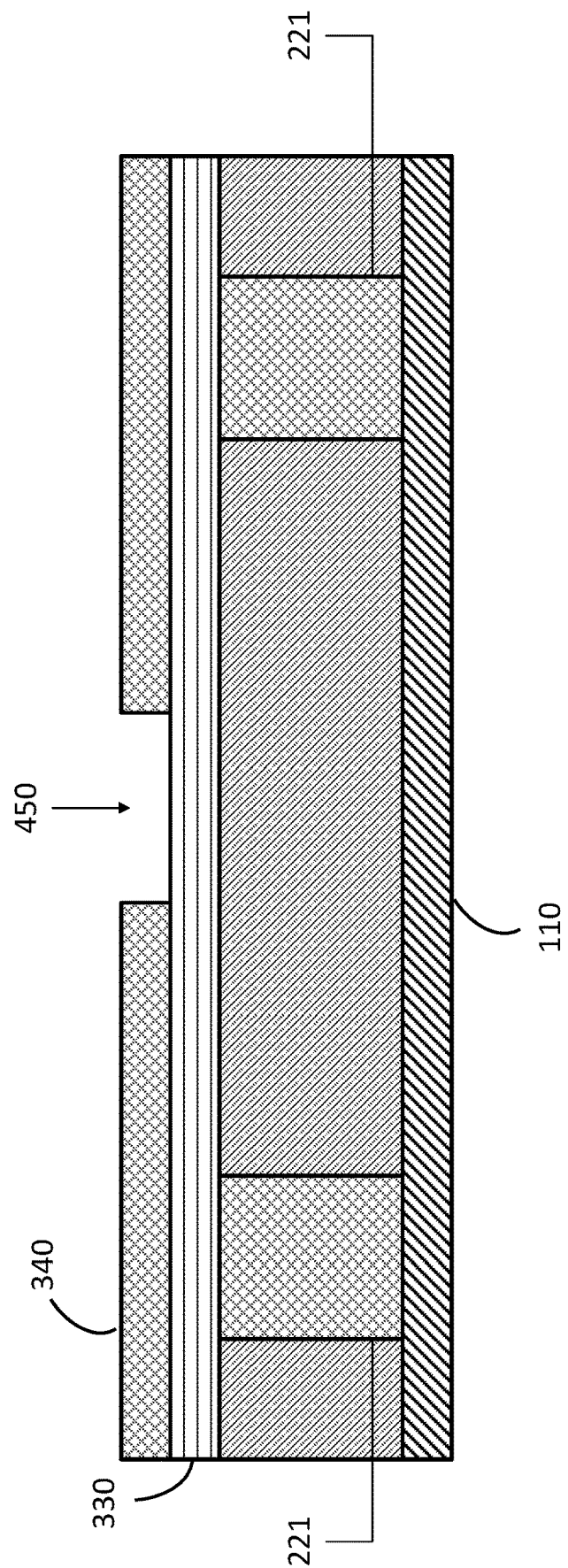
FIG. 5 is a partial cross-sectional view of a substrate coated with a resist layer having support pillars formed therein, topped with a mask layer and a patterned secondary resist layer.
Figure 6:
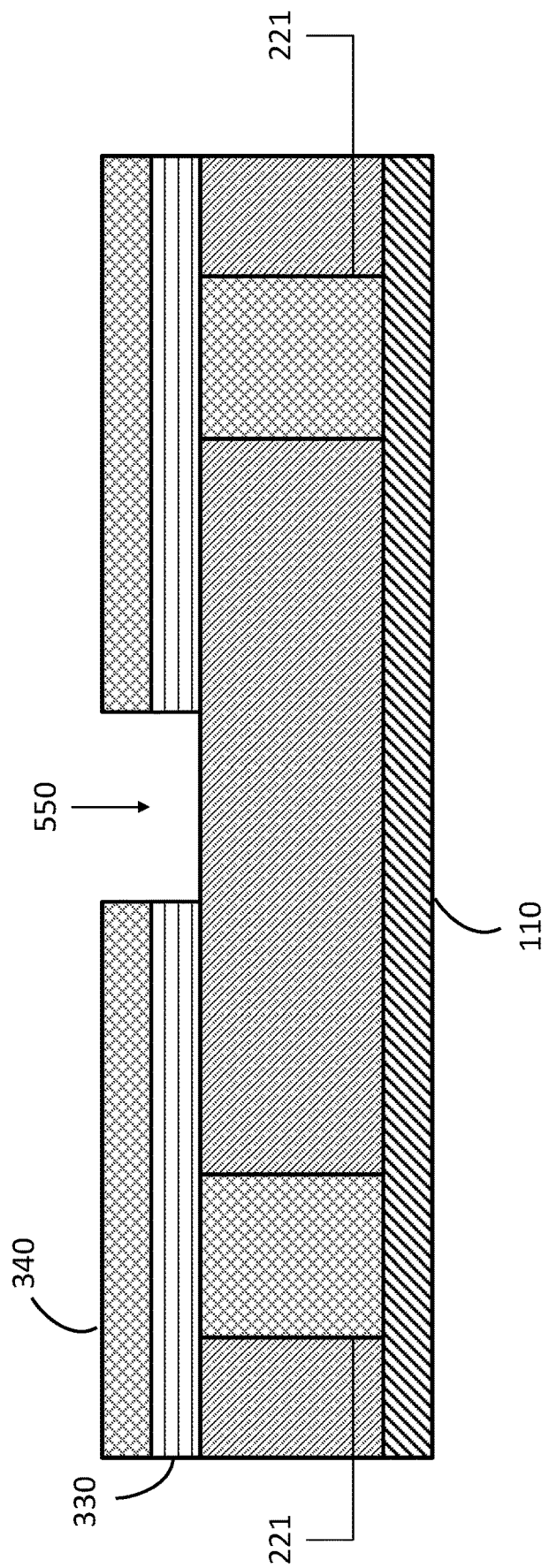
FIG. 6 is a partial cross-sectional view of a substrate coated with a resist layer having support pillars formed therein, topped with a patterned mask layer and a patterned secondary resist layer.

Once the support pillars 221 are formed, a mask is fabricated on the resist layer 120, as per step 103 of the method 100. The mask is made from an inorganic material, such as silicon or silicon oxide, and has at least one opening. FIGS. 4-6 illustrate an example embodiment for fabricating the mask. In FIG. 4, a mask layer 330 is deposited or grown on resist layer 120. In embodiments where the support pillars 221 are formed from pillar material deposited or grown inside openings in the resist layer 120, the same material may be used for the support pillars 221 and the mask layer 330. In addition, the support pillars 221 and the mask layer 330 may be deposited or grown in a single step.

The mask layer 330 is coated with a secondary resist layer 340 to allow patterning of the mask layer 330 using one or more lithography steps, which may be photolithography, extreme ultraviolet lithography, e-beam lithography, or any other type of lithography. The secondary resist layer 340 may be the same or a different material as the primary resist layer 120, such as but not limited to hydrogen silsesquioxane (HSQ) and hafnium peroxide sulfate (HafSOx).

In FIG. 5, part of the secondary resist layer 340 is removed via lithography and development steps to expose a portion of the mask layer 330 through opening 450, thus creating a mask pattern.

In FIG. 6, the mask pattern is transferred to the mask layer 330 by etching the portion of the mask layer 330 that is exposed through opening 450 in order to form opening 550. The rest of the mask layer 330 is protected from the etching by the secondary resist layer 340.

Figure 7:
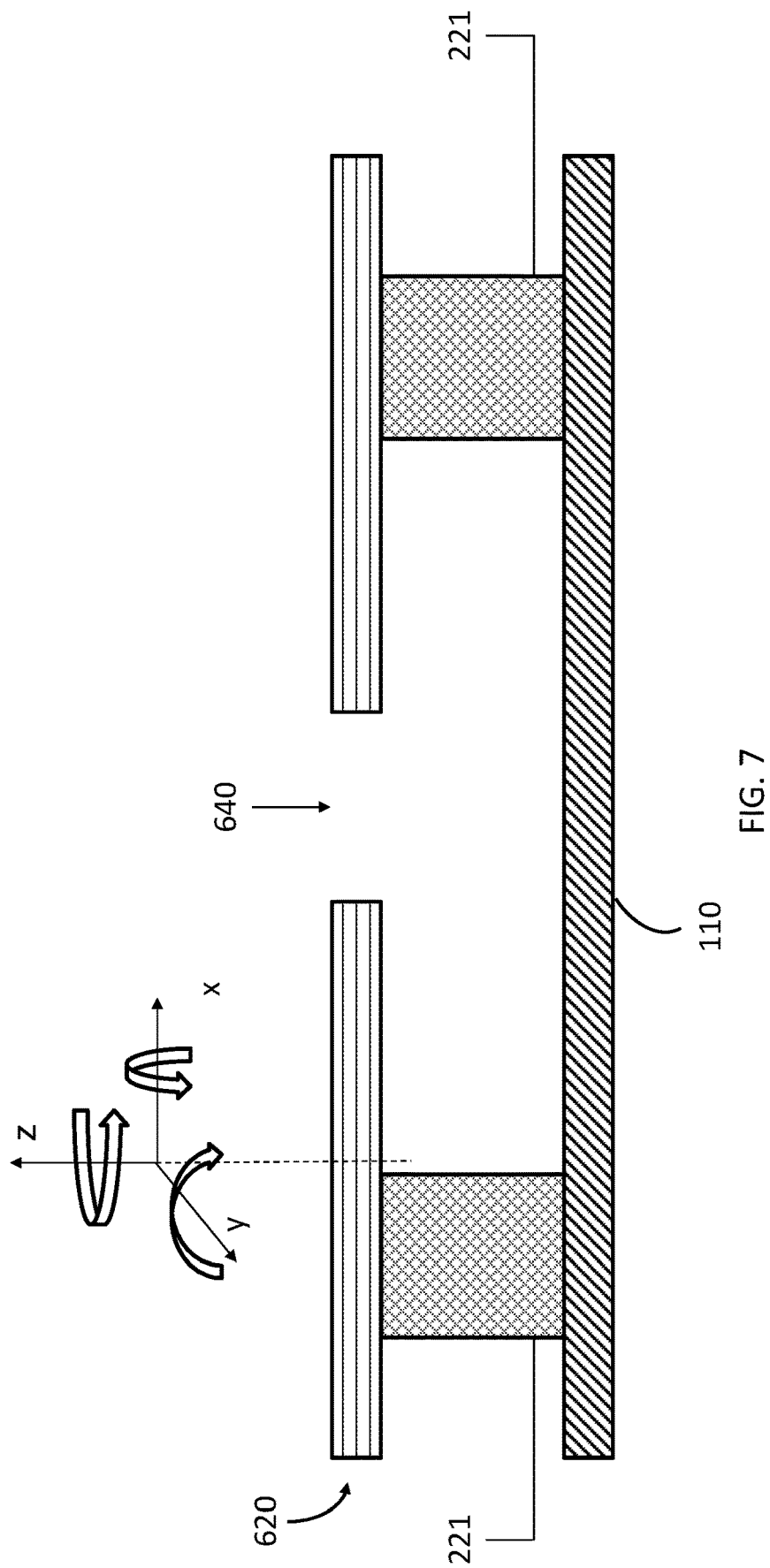
FIG. 7 is a partial cross-section view of a mask supported by pillars above a substrate.

Once the mask pattern has been transferred to the mask layer 330, the resist layers 120, 340 may be removed, as per step 105 of the method 100. In FIG. 7, the resist layers 120, 340 have been removed, leaving behind a mask 620 supported above the substrate 110 by the pillars 221. The primary resist layer 120 and secondary resist layer 340 may be removed through one or more of development and/or resist stripping processes, which may include steps of $O_2$ plasma ashing or similar procedures. The mask 620 is entirely organic free and can be used to fabricate a tunnel junction without any risk of contamination from organic materials.

As per step 107 of the method 100, shadow evaporation is performed on the substrate through the mask opening 640 to form the tunnel junction, and consists in the deposition of a source material that is then evaporated in a vacuum. The source material evaporates and condenses back to a solid state on the substrate. Vapors other than the source material are mostly removed before the process begins. Evaporated particles can travel directly to the substrate without colliding with the background gas. Protruding features of the mask 620 block the evaporated material from some areas of the substrate, hence the name "shadowing" or "step coverage".

Figure 8:
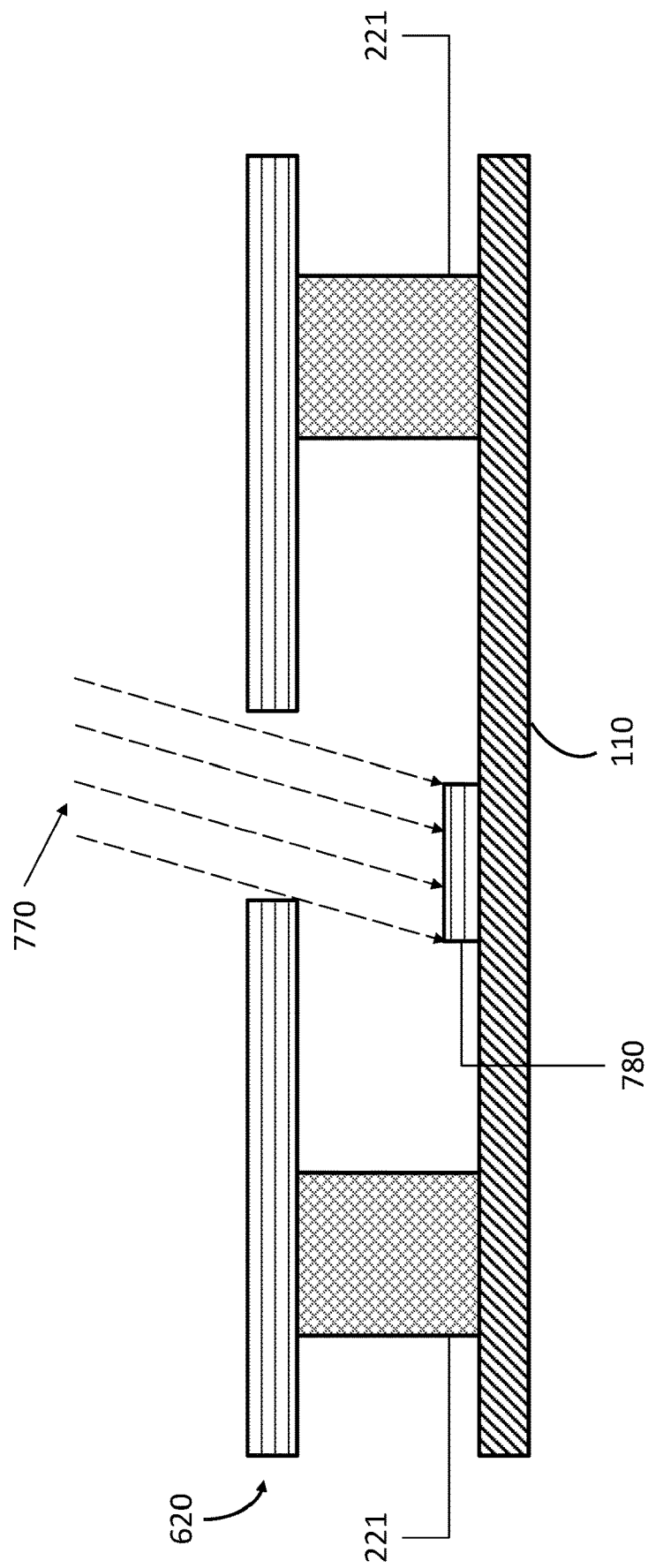
FIG. 8 is an example of shadow evaporation from a first angle.
Figure 9:
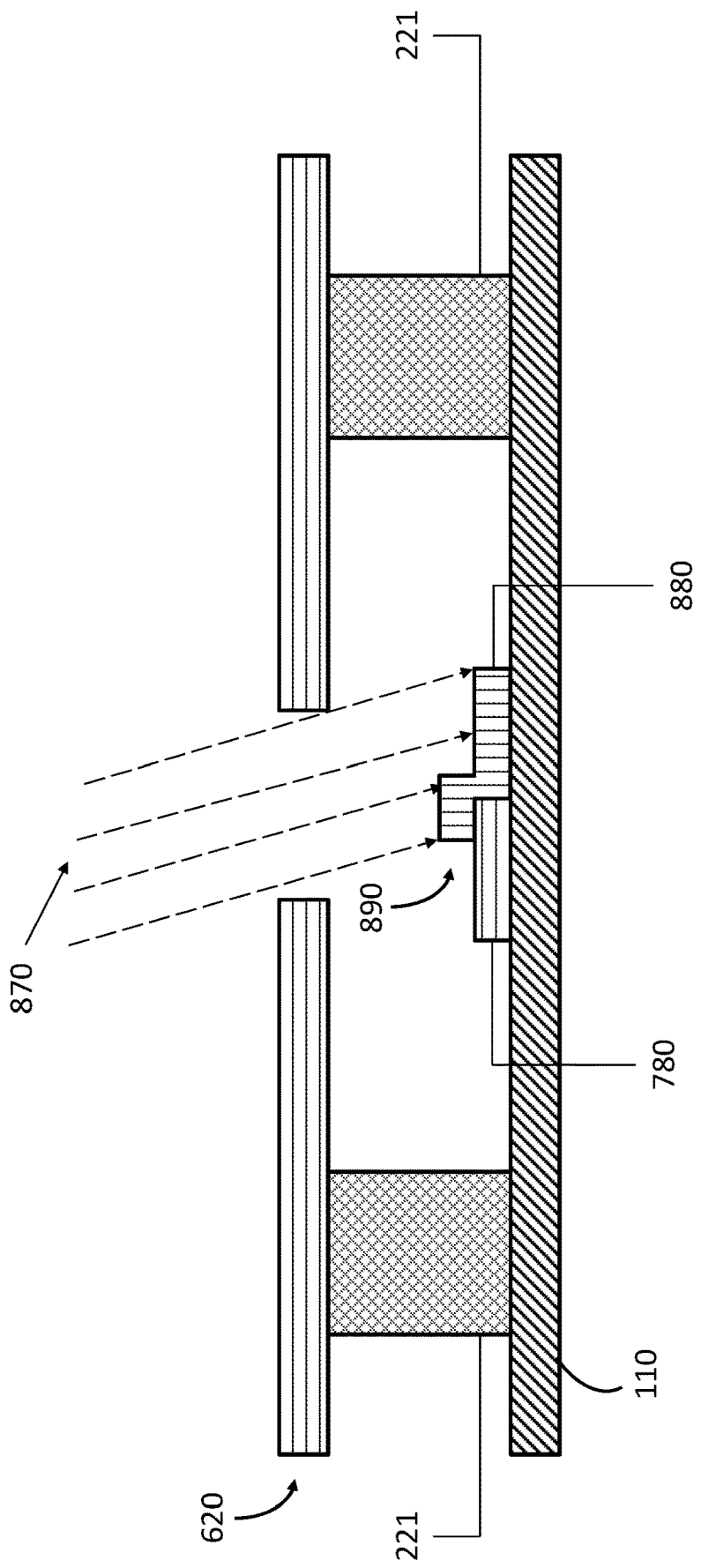
FIG. 9 is an example of shadow evaporation from a second angle.

In some embodiments, the tunnel junction is formed using double-angle shadow evaporation, such as those used in the Dolan technique or the Manhattan technique. An example is shown in FIGS. 8-9. FIG. 8 depicts a first evaporation step of an example shadow evaporation process. A beam 770 of evaporated atoms is directed towards the substrate 110 according to a first direction. The direction of the beam 770 is determined by the tilt angle of the beam 770 with respect to the normal of the substrate 110 as well as the in-plane orientation of the beam 770 with respect to the surface of the substrate 110. This results in the deposition of a first electrode layer 780 on the substrate 110.

FIG. 9 depicts a second evaporation step, where a second electrode layer 880 is deposited on the substrate 110 and partially overlaps with the first electrode layer 780 to form the tunnel junction 890. A beam 870 of evaporated atoms is directed towards the substrate 110 according to a second direction different from the first direction. Using the Dolan technique, the first and second directions of the beams 770, 870 differ by their tilt angle. Using the Manhattan technique, the first and second directions of the beams 770, 870 differ by their in-plane orientation with respect to the surface of the substrate. In other embodiments, the first and second directions of the beams 770, 870 may differ in both tilt angle and in-plane orientation.

In some embodiments, one or more other nanofabrication process, such as an oxidation process to form the barrier between the two electrode layers 780, 880, may take place between the first evaporation step and the second evaporation step. The electrode layers 780, 880 may be, for example, Aluminum (Al), Niobium (Nb), Hafnium (Hf), or Tantalum (Ta). The two evaporation steps as well as the oxidation step may be performed without breaking the vacuum, therefore enabling high quality tunnel junctions 890 of submicron size.

Figure 10:
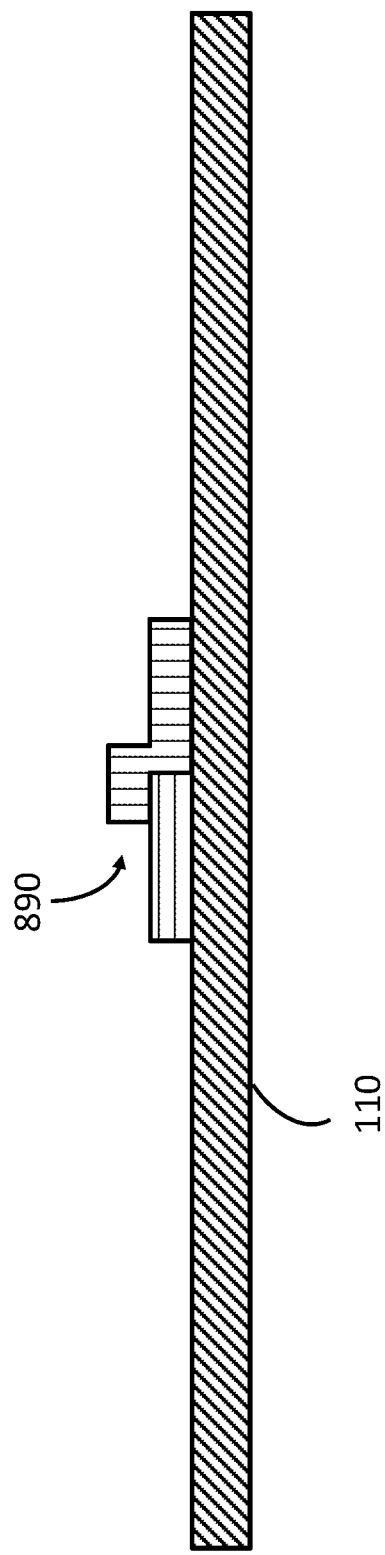
FIG. 10 is an example view of a resulting tunnel junction fabricated on a substrate.

Once the tunnel junction 890 is formed on the substrate 110, the mask 620 and support pillars 221 may be removed from the substrate, as per step 109 of the method 100, leaving behind only the tunnel junction 890. FIG. 10 shows an embodiment of a formed tunnel junction 890 on the substrate 110. In some embodiments, the mask 620 and support pillars 221 are stripped using hydrofluoric acid (HF) or plasma etching. In some embodiments, the substrate 110 is held upside down, such that the mask 620 is downward facing, in order to remove the mask by gravity once the support pillars 221 are stripped from the substrate 110.

It will be understood that the geometry of the tunnel junction 890 will be defined by the mask 620, the materials used to perform shadow evaporation, as well as other factors. For example, beam spreading of the beams 770, 870 may have an impact on film thickness, evaporation angles, or other geometric parameters of the tunnel junction. Beam spreading may be a result of the distance between the substrate and the source of the beams 770, 870. In some embodiments, the pattern of the mask 620 and/or the height of the support pillars 221 may be adjusted to account for beam spreading.

In contrast to a free-standing mask, and referring back to FIG. 7, the mask 620 is fixedly positioned on the substrate 110 with minimal risk of displacement during the subsequent tunnel junction fabrication steps. In addition, the mask 620 may be positioned with an alignment of the order of nanometers along the x, y, and z axes, as well yaw, pitch, and roll. When fabricating complex structures such as Josephson Junctions, such precision is needed to ensure a high yield.

The described embodiments and examples are illustrative and non-limiting. Practical implementation of the features may incorporate a combination of some or all of the aspects, and features described herein should not be taken as indications of future or existing product plans. Applicant partakes in both foundational and applied research, and in some cases, the features described are developed on an exploratory basis.

The term "connected" or "coupled to" may include both direct coupling (in which two elements that are coupled to each other contact each other) and indirect coupling (in which at least one additional element is located between the two elements).

Although the embodiments have been described in detail, it should be understood that various changes, substitutions, and alterations can be made herein without departing from the scope. Moreover, the scope of the present application is not intended to be limited to the particular embodiments of the process, machine, manufacture, composition of matter, means, methods and steps described in the specification.

As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

The invention claimed is:

1. A method for fabricating a tunnel junction, the method comprising:
    coating a substrate with an inorganic resist layer and forming support pillars in the inorganic resist layer;
    fabricating a mask on the inorganic resist layer from a first inorganic material, the mask having at least one opening;
    removing the inorganic resist layer from beneath the mask, leaving behind an organic-free structure comprising the support pillars supporting the mask above the substrate;
    performing shadow evaporation on the substrate through the at least one opening of the mask to form the tunnel junction on the substrate; and
    removing the mask and the support pillars from the substrate,
    wherein forming the support pillars in the inorganic resist layer comprises creating openings for the support pillars in the inorganic resist layer and forming the support pillars in the openings from a second inorganic material.

2. The method of claim 1, wherein the inorganic resist layer comprises one of hydrogen silsesquioxane (HSQ) and hafnium peroxide sulfate (HafSOx).

3. The method of claim 1, wherein forming the support pillars in the inorganic resist layer comprises patterning the support pillars in the inorganic resist layer using lithography.

4. The method of claim 1, wherein fabricating the mask on the inorganic resist layer comprises depositing a mask layer on the inorganic resist layer.

5. The method of claim 1, wherein the first inorganic material is one of silicon and silicon oxide.

6. The method of claim 1, wherein the first inorganic material and the second inorganic material are the same.

7. The method of claim 1, wherein fabricating the mask comprises:
    providing a mask layer on the inorganic resist layer;
    coating the mask layer with a secondary resist;
    patterning the secondary resist using lithography to remove part of the secondary resist and expose a portion of the mask layer; and
    etching the portion of the mask layer that is exposed to form the at least one opening therein.

8. The method of claim 1, wherein removing the mask and the support pillars from the substrate comprises stripping the support pillars.

9. The method of claim 8, wherein removing the mask and the support pillars from the substrate comprises holding the substrate upside down to strip the support pillars to remove the mask by gravity.

* * * * *